(12) United States Patent
Rütten et al.

(10) Patent No.: US 6,947,086 B1
(45) Date of Patent: Sep. 20, 2005

(54) IMAGING METHOD AND APPARATUS FOR IMAGING WITH LOW INCIDENT RADIATION

(75) Inventors: Walter Rütten, Linnich (DE); Falko Busse, Aachen (DE); Norbert Conrads, Raeren (BE)

(73) Assignee: Koninklijke Philips Electronics, N.V., Eindhoven (NL)

( * ) Notice: Subject to any disclaimer, the term of this patent is extended or adjusted under 35 U.S.C. 154(b) by 923 days.

(21) Appl. No.: 09/670,585

(22) Filed: Sep. 28, 2000

(30) Foreign Application Priority Data

Oct. 2, 1999 (DE) ................................ 199 47 536

(51) Int. Cl.$^7$ ............................ H04N 5/32; H05G 1/64
(52) U.S. Cl. ................. 348/304; 348/216.1; 250/208.1; 378/98.8
(58) Field of Search ....................... 250/208.1; 348/77, 348/208.13, 216.1, 217.1, 294, 297, 298, 348/302, 304, 307, 308, 309, 317, 319, 322, 348/323, 333.11; 382/299; 358/513, 538; 378/98.8

(56) References Cited

U.S. PATENT DOCUMENTS

| | | | | |
|---|---|---|---|---|
| 4,996,413 A | * | 2/1991 | McDaniel et al. | 348/302 |
| 5,262,871 A | * | 11/1993 | Wilder et al. | 348/307 |

(Continued)

FOREIGN PATENT DOCUMENTS

| | | | | |
|---|---|---|---|---|
| DE | 19524858 A | | 1/1997 | ............ G01T 1/24 |
| EP | 0444869 A2 | | 9/1991 | ............ A61B 6/00 |
| EP | 0776124 | | 5/1997 | ............ H04N 3/15 |
| GB | 2332585 A | | 6/1999 | |
| GB | 2332800 A | * | 6/1999 | ............ H04N 3/15 |

OTHER PUBLICATIONS

Zhou et al.; "Frame-Transfer CMOS Active Pixel Sensor with Pixel Binning"; Oct. 1997; IEEE Transactions on Electron Devices; vol. 44, No. 10, pp. 1764-1768.*

(Continued)

*Primary Examiner*—Wendy R. Garber
*Assistant Examiner*—John M. Villecco

(57) ABSTRACT

The invention relates to a method of reading out the sensor elements of a sensor (1) with a matrix of light-sensitive or X-ray-sensitive sensor elements ($S_{1,2}$; $S_{1,2}$ ...) which are arranged in rows and columns and generate charges in dependence on the incident quantity of radiation, the switches (3) of the relevant sensor elements being activated via address lines (4, ..., 8, ...) and the charges of the respective activated sensor elements being drained via read-out lines (9, 10, 11, ...) so as to be processed further by way of amplifiers (14, ..., 18, ...) and transfer means (19). The invention also relates to a corresponding sensor as well as to an X-ray examination apparatus which includes an X-ray source for emitting an X-ray beam for irradiating an object in order to form an X-ray image, as well as a detector for generating an electrical image signal from said X-ray image. Despite the small incident X-ray doses, adequate amounts of charge, and hence electrical signals, are provided so as to form the image in that ingoing address lines (4, ..., 8, ...) are selectably connected, by way of individually controllable switch elements (27, ..., 30, ...) and by means of a switching operation, to each time the respective next address line and the sensor elements of at least two neighboring lines are activated by means of one ingoing signal, and corresponding outgoing read-out lines (9, ..., 13, ...) are selectably connected, by way of individually controllable switch elements (31, ..., 34, ...) and by means of a switching operation, to the respective next read-out line in such a manner that the charge signals read out from the activated sensor elements of at least two neighboring columns are combined so as to form one output signal.

4 Claims, 3 Drawing Sheets

U.S. PATENT DOCUMENTS

| | | | |
|---|---|---|---|
| 5,812,191 A * | 9/1998 | Orava et al. | 348/308 |
| 5,949,483 A * | 9/1999 | Fossum et al. | 250/208.1 |
| 5,973,311 A * | 10/1999 | Sauer et al. | 250/208.1 |
| 6,249,618 B1 * | 6/2001 | Hou | 382/312 |
| 6,255,638 B1 * | 7/2001 | Eraluoto et al. | 250/208.1 |
| 6,365,886 B1 * | 4/2002 | Ang et al. | 250/208.1 |
| 6,437,338 B1 * | 8/2002 | Hoffman | 250/208.1 |
| 6,452,153 B1 * | 9/2002 | Lauxtermann et al. | 250/208.1 |
| 6,552,319 B2 * | 4/2003 | Pyyhtia et al. | 250/208.1 |
| 6,590,198 B1 * | 7/2003 | Zarnowski et al. | 250/208.1 |
| 6,665,012 B1 * | 12/2003 | Yang et al. | 348/308 |
| 6,878,918 B2 * | 4/2005 | Dosluoglu | 250/208.1 |
| 2005/0012836 A1 * | 1/2005 | Guidash | 348/302 |

OTHER PUBLICATIONS

Coulombe et al.; "Variable Resolution CMOS Current Mode Active Pixel Sensor"; May 28, 2000; IEEE International Symposium on Circuits and Systems.*

* cited by examiner

IMAGING METHOD AND APPARATUS FOR IMAGING WITH LOW INCIDENT RADIATION

BACKGROUND OF THE INVENTION

The invention relates to a method of reading out the sensor elements of a sensor with a matrix of light-sensitive or X-ray sensitive sensor elements which are arranged in rows and columns and generate charges in dependence on the incident quantity of radiation, the switches of the relevant sensor elements being activated via address lines and the charges of the respective activated sensor elements being drained via read-out lines so as to be processed further by way of amplifiers and transfer means. The invention also relates to a corresponding sensor as well as to an X-ray examination apparatus which includes an X-ray source for emitting an X-ray beam for irradiating an object so as to form an X-ray image, as well as a detector for generating an electrical image signal from said X-ray image.

SUMMARY OF THE INVENTION

Large-area X-ray detectors, consisting of a sensor matrix with a plurality of sensor elements or pixels which are arranged in rows and columns, are used in the field of medical X-ray diagnosis. The sensor elements include photodiodes of amorphous silicon and associated scintillator elements or, alternatively, photoconductors for converting the X-rays into an electrical charge. Each sensor element is provided with a switch for the reading out of the charge, for example, with TFT (thin-film transistor) switches of amorphous silicon or diode switches. The switches are closed or activated so as to read out the collected charges conducted to appropriate read-out lines wherefrom the charges flow into appropriate charge-sensitive amplifiers which subsequently apply an electronic signal to a multiplexer which applies the charge signals from the relevant read-out lines to a data acquisition unit so as to be reproduced by means of a monitor which acts as an image display apparatus.

When detectors of this kind are used for medical examinations, it is desirable to reduce the radiation dose in order to realize a low dose whereto the patient is exposed; consequently, only a very small amount of charge is incident on the individual sensor elements. Therefore, the electrical charge produced in the individual sensor elements (in dependence on the incident amount of radiation) is also very small. This often gives rise to problems, that is, a comparatively strong noise is superposed on the signal read out. In this context it is known to perform so-called binning, that is, group-wise reading out of sensor elements or the reading out of a spatial average of pixels.

EP 0 776 124 A2 discloses a method and a device for the imaging of an object by detection of radiation while utilizing an image sensor system. In order to ensure an optimum ratio of image resolution to sensitivity of the sensor, the charges of the sensor elements are read out along the individual rows or columns of the sensor matrix, after which they are group-wise combined. The versions of the method proposed for this purpose are based on a modification of control signals whose execution can be programmed. EP 0 776 124 A2 is focused notably on the binning of CCD sensors.

The process of reading out the charges in the individual sensor elements or pixels in known detectors, based on conventional matrix sensors, is conventionally performed in rows or in columns. For example, when the first row is to be read out, the switches of the sensors present in this row are activated by way of the respective corresponding address line. The charges stored in the capacitances of the sensor elements present in this row are then drained via the respective electrical switch of the relevant sensor elements and the corresponding read-out line.

For such sensors it is also known to use a binning operation by extending the row-wise scans from one row to a plurality of rows by means of known shift registers. It is a drawback, however, that the number of combined rows or columns is constant within an exposure.

For the column-wise reading-out, for which customarily a charge amplifier is provided for each column and each read-out lead, binning is achieved by interconnecting two neighboring read-out lines in an amplifier, by interconnecting two neighboring amplifier channels, or by calculating an average during the subsequent image processing. According to the first two methods reading-out can take place only column-wise or in defined groups of columns. Even though the calculation method offers increased flexibility in relation to the other two methods, the desired low noise is achieved only by means of the first method; however, the combining of each time two neighboring read-out lines concerns the entire detector.

Considering the foregoing it is an object of the present invention to provide a method and a sensor which offer, despite the low incident X-ray doses, adequate quantities of charge and hence adequate electrical signals for the formation of the image.

This object is achieved by means of a method which is characterized in that ingoing address lines are selectably connected, by means of individually controllable switch elements and by way of a switching operation, to the respective next address line in such a manner that the sensor elements of at least two neighboring rows are activated by means of one ingoing signal, and that corresponding outgoing read-out lines are selectably connected to the respective next read-out line by means of individually controllable switch elements and by way of a switching operation, in such a manner that the charge signals read out from the activated sensor elements of at least two neighboring columns are combined so as to form one signal and are applied to only one amplifier.

Under the control of switching operations either the relevant connection of the address line or read-out line to the switches per row or column is maintained or a connection is established with the respective neighboring line, that is, either the respective preceding line or the subsequent line. The overlapping of an arbitrarily selected number of rows of activated sensor elements as well as an arbitrarily selected number of columns thus enables the formation of an individually programmable binning pattern, that is, arbitrary blocks of rows and columns. Not only the size of the individually read out surfaces of sensor elements can thus be programmed, but also the temporal succession of different binning patterns. Spatially inhomogeneous binning, that is, the reading out of different surfaces in different regions of the detector, can thus be realized.

The binning size, that is, the number of combined rows or columns, is preferably varied within a frame or exposure. The use of different binning sizes enables enhancement of the signal-to-noise ratio by stronger binning in positions with a weak signal whereas full resolution can be maintained in positions with a good signal-to-noise ratio.

The proposed method enables variation of the size of the binning blocks within an image. In regions in which the individual sensor element provides only a poor signal-to-noise ratio, the noise is reduced by binning over larger regions (2×2, 3×3, or also asymmetrically), thus enhancing the signal-to-noise ratio. The accompanying lower spatial resolution is accepted. In regions in which the individual sensor element already provides a good signal-to-noise ratio, binning over only small regions (2×2) or even no binning (1×1) is selected, thus maintaining a high spatial resolution.

Overall, the undesirable noise can be minimized by binning the charges read out before the amplifiers. Moreover, in conformity with a further development of the method it should be possible to intervene in the originally programmed read-out routine of binning patterns during the exposure.

Such a variably programmable binning pattern is attained by means of a sensor which is characterized in that a first unit of switch elements is arranged between the activation means and the electrical sensor switches and a second unit of switch elements is arranged between the electrical sensor switches and amplifiers. Additionally there is provided a system for the individual control of the switch elements so as to connect, by way of a switching operation, an arbitrary number of switch or read-out lines to each time at least one neighboring line. Overall the control system determines whether and which switch elements carry out a switching operation and hence whether the corresponding sensor row or sensor column is read out together with neighboring rows or columns or strictly in rows or columns in the customary manner.

The switch elements in a first embodiment according to the invention are arranged in or on the address or read-out lines and hence in the activation or read-out circuits. In a second embodiment they are integrated directly in the sensor matrix in that either they are made of amorphous silicon, like the photodiodes and the TFT switches of the sensor elements, or in that they are arranged on (recrystallized) polycrystalline silicon.

The control system for the first and the second unit of switch elements in a preferred embodiment is constructed as a first and a second shift register with a plurality of shift register elements, a respective shift register element being associated with a switch element per address line or read-out line. The first shift register serves as a series/parallel converter and the second shift register as a parallel/series converter. In order to form an arbitrary binning pattern with plane groups of sensor elements which are interrupted by conventionally read out rows or columns, the shift registers are constructed in such a manner that the individual shift register elements which are not to participate in a binning operation are automatically skipped. One clock pulse thus suffices to address a next block of rows which is separated from a first block by the skipped row.

The control shift register is preferably constructed so as to be double buffered. A new binning pattern can thus be clocked into a first storage location whereas the non-modified binning control information for the corresponding blocks of rows or columns is retained in a second storage location. After completion of the block the new control information is transferred from the first storage location to the second storage location of the control shift register.

Instead of the shift register, or in addition thereto, a random addressable register is used so as to realize fast updating of the binning pattern. A double-buffered chart is again preferred.

BRIEF DESCRIPTION OF THE DRAWINGS

Further details and advantages of the invention are apparent from the dependent claims and the following description in which the embodiments of the invention as shown in the Figures are further elucidated. Therein:

FIG. 1 shows a circuit diagram of an X-ray sensor matrix 1 with two shift registers for activating the switches of the sensor elements; FIG. 2 shows the circuit diagram of an X-ray sensor matrix with two shift registers for reading out the activated electrical switches of the sensor elements.

DESCRIPTION OF THE PREFERRED EMBODIMENTS

Figure 1:
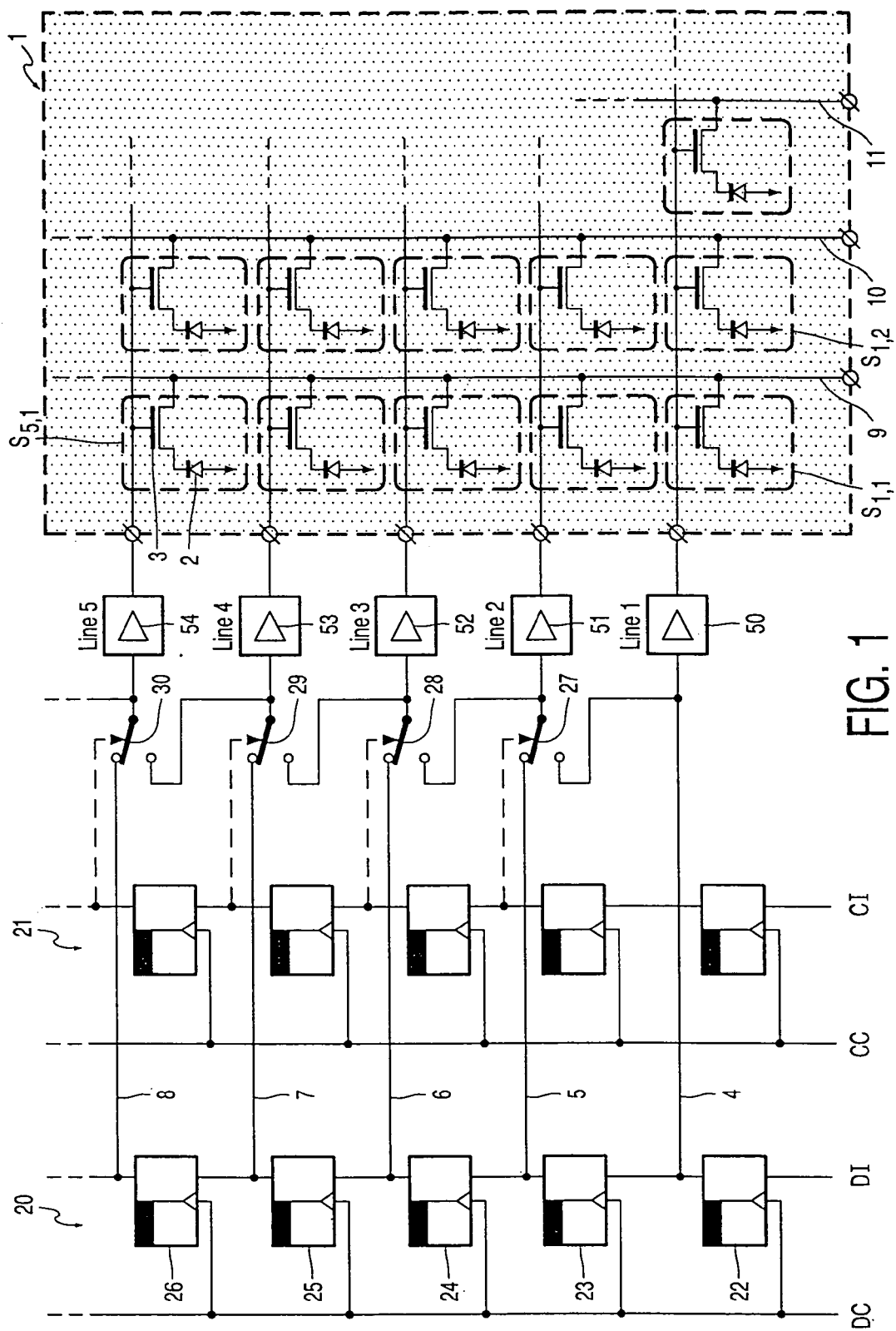
FIG. 1 shows a circuit diagram of a sensor matrix with an activation circuit influenced in accordance with the invention.

FIG. 1 shows a part of a sensor matrix 1 in which the sensor elements are arranged in rows and columns. A matrix of this kind may include, for example, 2000×2000 sensor elements, only a few of which are shown by way of example in the FIGS. 1 and 2. For a better understanding of the following description, the sensor elements in FIG. 1 are associated with a given, consecutively numbered row, so $S_{1,1}$, $S_{1,2}$ etc.; the first index indicates the row and the second index the column.

For each pixel there is provided an X-ray sensitive sensor element which includes a photosensor 2, a capacitance and a switch 3. The photosensors themselves may already be X-ray sensitive when use is made of suitable semiconductors. However, a light-sensitive photodiode may also be concerned, the conversion of X-rays into light then taking place by means of an additional scintillator. The photosensors are represented by the photodiodes 2 in the FIGS. 1 and 2. The electronic switches 3 are preferably constructed as TFTs (thin-film transistors). The photosensor with scintillator converts incident X-rays into charges which are collected by the capacitance. The capacitance may be either an integral part of the photodiode or be constructed as a separate component. The charge stored in the capacitance after a given period of time is a measure of the radiation intensity. This charge can be read out, via the electrical switches, for each sensor element. To this end, an address line 4 to 8 is provided for each row of the sensor matrix. The electrical switches 3 of the associated row can be activated via these address lines.

Figure 2:
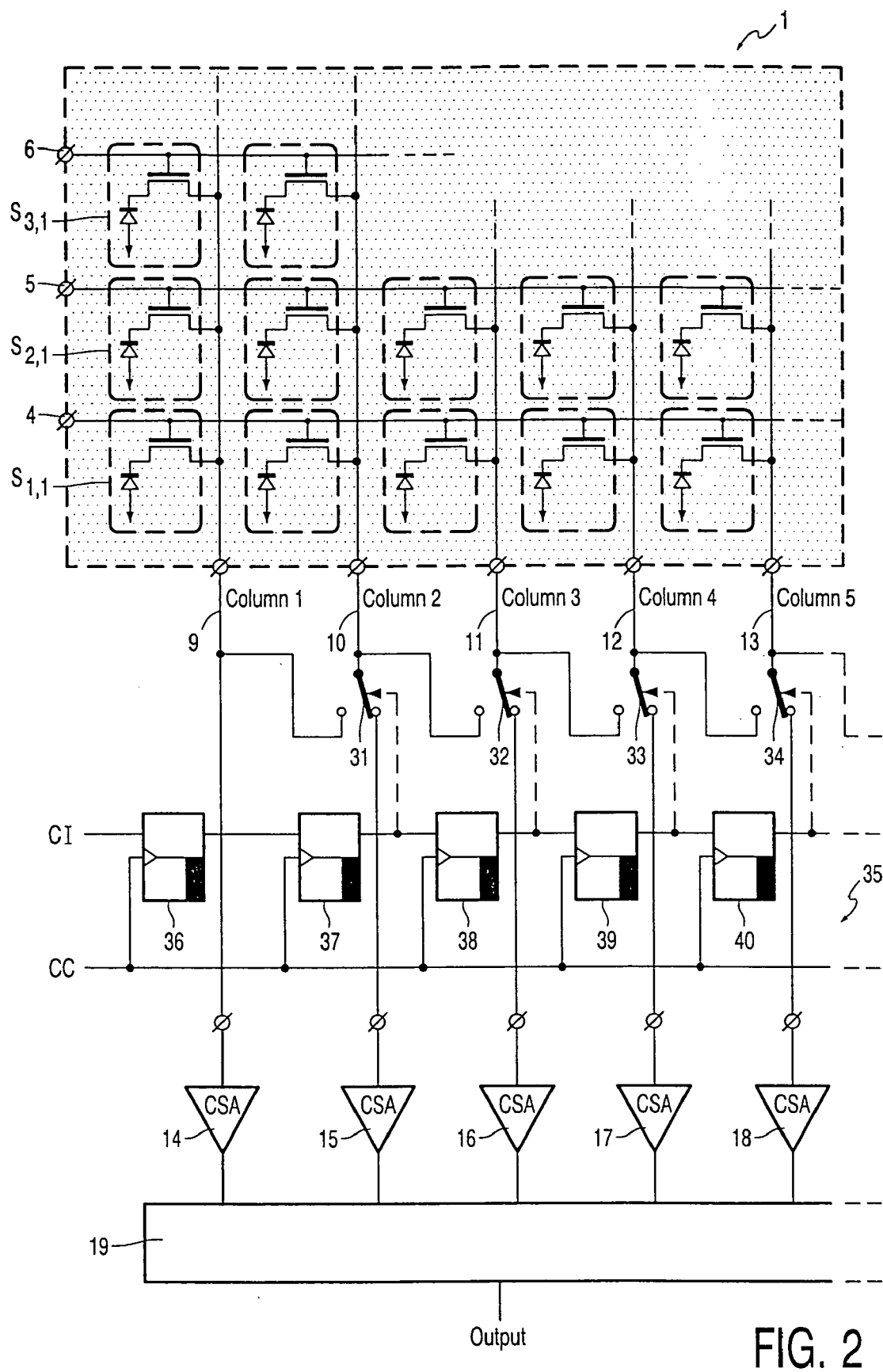
FIG. 2 shows the corresponding circuit diagram of a sensor matrix with a read-out circuit influenced in accordance with the invention.

For each column of the matrix which is partly shown in FIG. 1 there is provided a respective read-out line 9, 10, 11, the circuits succeeding the read-out lines being clarified in FIG. 2. The read-out lines, denoted by the reference numerals 9 to 13 in FIG. 2, are connected to respective amplifiers 14 to 18 which conduct the output signals to a multiplexer 19. The multiplexer 19 delivers the electronic image signal to a monitor or an image processor.

As opposed to the conventional sensor matrices, where exclusively a binning pattern which is identical across the entire detector can be selected, the sensor matrix according to the invention enables, in conjunction with preceding and succeeding circuits, reading out in conformity with a locally selectable or programmable binning pattern in an image is possible, i.e. a non-constant binning pattern.

To this end, the sensor matrix 1 is preceded by two shift registers 20, 21 in the embodiment shown in FIG. 1. The shift register 20 is also referred to as an activation means and consists of a plurality of successively connected memories or shift register elements 22 to 26, the number of which corresponds to the number of rows of the sensor matrix. The construction of the circuit is such that a shift pulse (in this case denoted by the reference DC for Data Clock) causes all memories to shift their information (DI for Data Input) to the respective neighboring memory. This shift register is succeeded by switch elements 27 to 30. In the present embodiment the address lines 5 to 8 comprise such a switch element; the address line 4, however, does not have a predecessor line and hence does not require a switch element.

The address lines either are connected directly to the corresponding row of sensor elements or the individual address lines are interrupted by means of the switch elements and a connection to the relevant predecessor address line is established. The sensor elements of at least two neighboring rows can thus be activated by means of one ingoing signal. In the present example the fifth line (8) is connected to the fourth address line (7), the fourth line (7) is connected to the third address line (6), the third line (6) is connected to the second address line (5) and the second line (5) is connected to the first address line (4). As a result, the information of the first address line (4) activates the sensor elements of the rows 1 to 5.

An arbitrary number of associated rows can be activated by arbitrary control of the switching processes of the switch elements. The switch elements 27 to 30 are controlled by means of an additional shift register 21. Information (CI for Control Input) in the form of control instructions for switching over the relevant address lines is output at the rhythm of the shift frequency (CC for control clock).

Amplifiers 50 to 54 are inserted in the address lines between the register and the sensor matrix. Alternatively, level converters could be used. Such converters boost the often small output voltages of the purely digital control signals (for example, amounting to 5 V for the shift register) to the value required so as to control the TFTs, which usually require from 20 to 25 V.

The switch elements 27 to 30 in the address lines or the activation switch elements may be TFTs. Using a double construction with opposed control, these transistors implement a respective switch element. In this case the (analog) voltage of the activation line could be switched behind the amplifier or level converter. In the embodiment shown in FIG. 1 the amplifiers 50 to 54 are preceded by the switch elements 27 to 30. Alternatively, use can be made of a two-input digital multiplexer whose digital output signal is raised to the necessary amplitude by means of amplifiers or level converters.

Only purely analog switches, for example TFT or (MOS) FET, are suitable for the switch elements 31 to 34 in the read-out lines, because the charges are transferred from the sensor elements without modification.

The control of switching operations of switch elements for the read-out lines (FIG. 2) is the same as described with reference to FIG. 1. FIG. 2 again shows the sensor matrix 1 only partly, that is, in this case with three rows and five columns. In conformity with the known method the charge of the sensor elements of each column is read out by means of a read-out line 9 to 13 which is connected to a respective amplifier, in this case denoted by the references 14 to 18. The outputs of the individual amplifiers are combined in a multiplexer 19 and output as an output signal. As a further development according to the invention there is provided a unit of switch elements 31 to 34; the second and the subsequent columns now include a switch element which is inserted in the relevant read-out line. The switch elements connect the relevant read-out line either directly to the associated amplifier or to the respective neighboring read-out line. In the present example the second read-out line (10) can be connected to the first read-out line (9), the third read-out line (11) can be connected to the second read-out line (10) etc. by way of switching operations. A collected amount of charge is thus applied to the amplifier (14) only by the first read-out line (9).

The individual switch elements 31 to 34 are controlled by means of a shift register 35. Control itself is analogous to the described control of the address lines.

Figure 3:
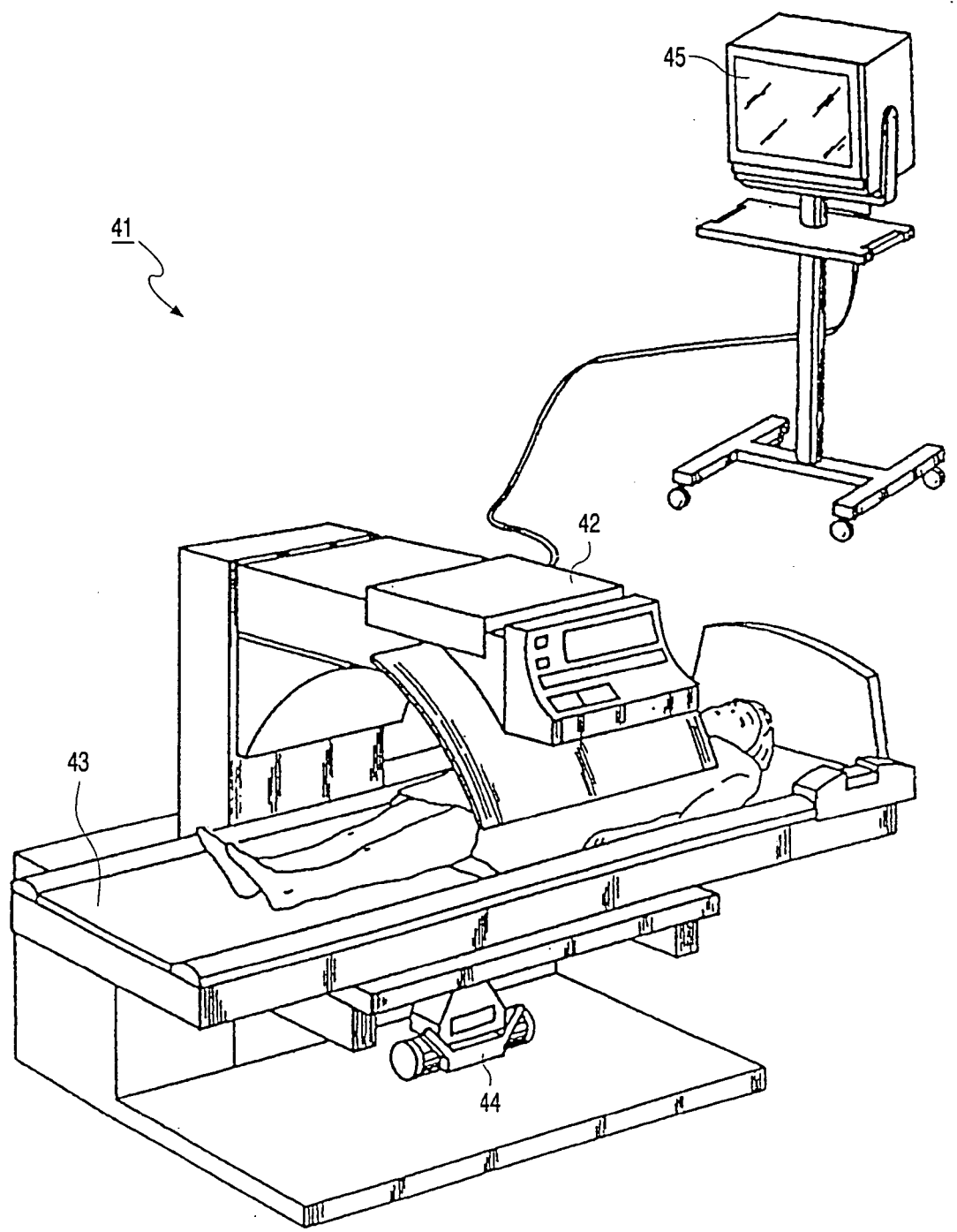
FIG. 3 shows an X-ray examination apparatus which includes an X-ray sensor in accordance with the invention.

FIG. 3 shows a medical X-ray examination apparatus 41 which is provided with a detector 42 which includes an X-ray sensor in accordance with the invention. The X-ray examination apparatus 41 includes a table 43 for a patient. An X-ray source 44 is mounted underneath the table. The X-ray detector 42 is mounted so as to be adjustable relative to the radiation source 44. In order to form an X-ray image, the patient is irradiated by means of an X-ray beam. An X-ray image is formed by means of the detector in dependence on local differences in the X-ray absorption by the patient. The X-ray sensor converts this image into electrical signals which are applied to the monitor 45 for displaying the X-ray image. Despite the use of low radiation doses so as to reduce the patient load, the sensor in accordance with the invention enables the reading out of adequate charge intensities for the formation of the X-ray image, reading out taking place in blocks of rows and columns of programmable size.

What is claimed is:

1. A sensor with a matrix of light-sensitive or X-ray sensitive sensor elements ($S_{1,1}$; $S_{1,2}$, ...) arranged in rows and columns, which sensor elements generate charges in dependence on a quantity of radiation incident thereon, including a respective switch (3) with an address line (4, ..., 8, ...) for each sensor line for connection to activation means (20) via which the electrical sensor switches can be activated, a read-out line (9, ... 13, ...) for each sensor column via which the charges of the respective activated sensor elements are drained, transmission means (19) at the end of the relevant read-out line for converting the signals read out in parallel into a serial signal, and a plurality of amplifiers (14, ... 18, ...) arranged to precede the transmission means, wherein a first unit of switch elements (27, ... 30, ...) is arranged between the activation means (20) and the electrical sensor switches, a second unit of switch elements (31, ... 34, ...) is arranged between the electrical sensor switches and amplifiers (14, ... 18, ...), and a system (21, 35) for controlling the switching operations of the switch elements is included in order to connect each switch element or a read-out line to at least one neighboring lines, and wherein the control system for the first and the second unit of switch elements consists of a first and a second shift register (20, 35) with a plurality of shift register elements (22, ..., 26, ...; 36, ..., 40, ...), where each shift register element being associated with one switch element per address line or readout line.

2. A sensor as claimed in claim 1, characterized in that a shift register is constructed so as to be bidirectional.

3. A sensor as claimed in claim 1, characterized in that additionally to the two shift registers (20, 35), or instead of the shift registers, there is provided a random accessible register.

4. A sensor as claimed in claim 1, characterized in that the relevant control shift register is double buffered.

* * * * *